US005682118A

United States Patent [19]

Kaenel et al.

[11] Patent Number: 5,682,118

[45] Date of Patent: Oct. 28, 1997

[54] CIRCUIT FOR CONTROLLING THE VOLTAGES BETWEEN WELL AND SOURCES OF THE TRANSISTORS OF AND MOS LOGIC CIRCUIT, AND SYSTEM FOR SLAVING THE POWER SUPPLY TO THE LATTER INCLUDING THE APPLICATION THEREOF

[75] Inventors: Vincent Von Kaenel, Coffrane; Matthijs Daniël Pardoen, Marin, both of Switzerland

[73] Assignee: C.S.E.M. Centre Suisse d'Electronique et de Microtechnique S.A., Neuchatel, Switzerland

[21] Appl. No.: 409,712

[22] Filed: Mar. 24, 1995

[30] Foreign Application Priority Data

Mar. 25, 1994 [FR] France .................................. 94 03641

[51] Int. Cl.[6] ...................................................... H03K 3/01

[52] U.S. Cl. .......................... 327/534; 327/530; 327/538

[58] Field of Search .................................... 327/534, 535, 327/538, 540, 541, 530; 257/288

[56] References Cited

U.S. PATENT DOCUMENTS

| | | |
|---|---|---|
| 4,435,652 | 3/1984 | Stevens . |
| 4,533,846 | 8/1985 | Simko . |
| 4,670,670 | 6/1987 | Shoji . |
| 4,791,318 | 12/1988 | Lewis et al. . |
| 5,099,146 | 3/1992 | Miki et al. .............................. 327/534 |
| 5,103,277 | 4/1992 | Caviglia et al. ....................... 357/23.7 |

FOREIGN PATENT DOCUMENTS

| | | |
|---|---|---|
| 0106413 | 4/1984 | European Pat. Off. . |
| 0262357 | 4/1988 | European Pat. Off. . |
| 0382929 | 8/1990 | European Pat. Off. . |
| 0404008 | 12/1990 | European Pat. Off. . |
| 9401890 | 1/1994 | WIPO . |

OTHER PUBLICATIONS

Sedra et al., "Microelectronic Circuits", 1991, FIG. 6.46.

*Primary Examiner*—Timothy P. Callahan
*Assistant Examiner*—Jung Ho Kim

[57] ABSTRACT

The control circuit includes a reference MOS transistor (24) on which predetermined operating characteristics are imposed. Circuitry (21, 22, 23) is provided for comparing an operating characteristic of the transistor (24) with a reference value ($V_{thref}$) so as to produce a control voltage. This voltage, after adaptation, is applied to the transistor (24) so as to fix the threshold voltage ($V_{th}$) thereof, in such a way as to maintain the operating characteristics of the transistor (24). This same threshold voltage is then imposed on all the transistors of the logic circuit with which the control circuit is associated. This control circuit makes it possible particularly to reduce the consumption of said logic circuit.

18 Claims, 6 Drawing Sheets

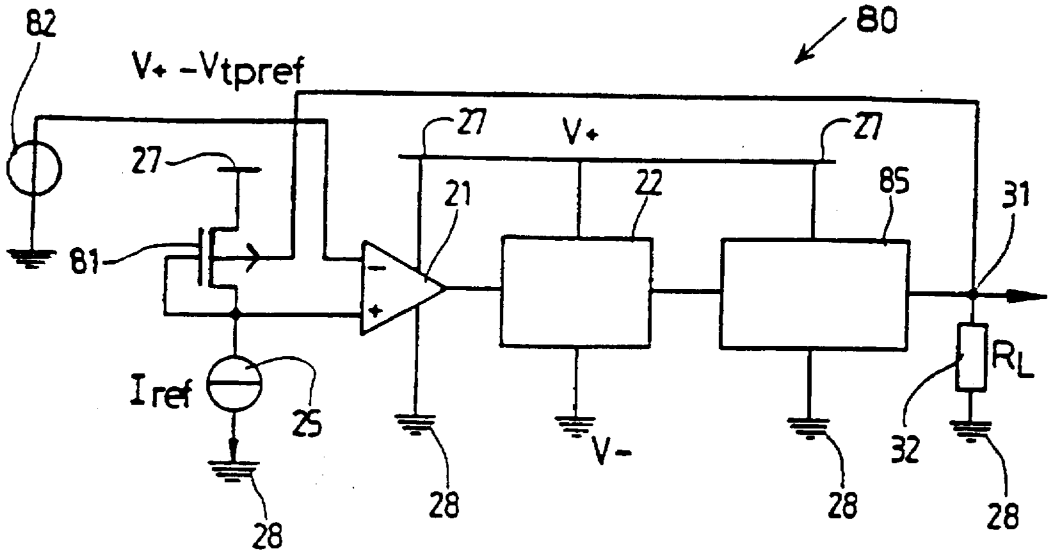
Fig.5
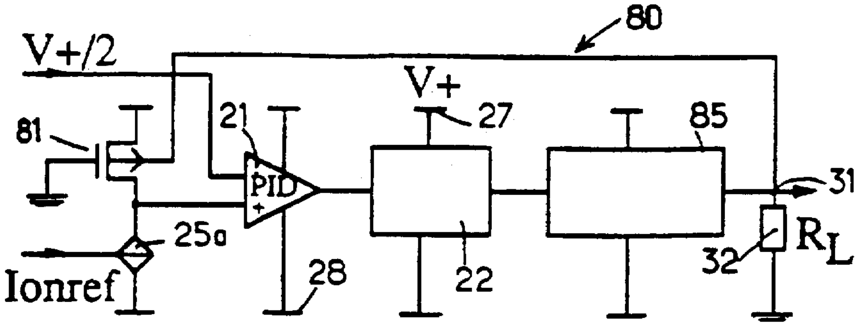
Fig.6
Fig.8
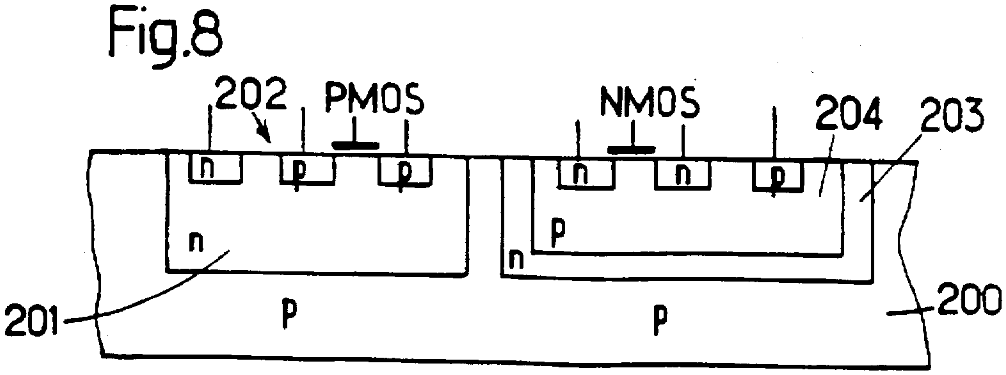

CIRCUIT FOR CONTROLLING THE VOLTAGES BETWEEN WELL AND SOURCES OF THE TRANSISTORS OF AND MOS LOGIC CIRCUIT, AND SYSTEM FOR SLAVING THE POWER SUPPLY TO THE LATTER INCLUDING THE APPLICATION THEREOF

The present invention relates to circuits produced in CMOS technology, and in which transistors with at least one of the types of conductivity are arranged in a common well provided in the substrate of the integrated circuit.

Circuits of this type exhibit the characteristic of being able to work with a regulated bias voltage of the well so as to adjust the threshold voltage of the transistors, essentially for the purpose of reducing the consumption by the circuit.

Such a circuit is described in the PCT patent application WO 94/01890. In this case, it is sought, above all, to be able to make the circuit operate with different power supply voltages, while guaranteeing the correct operation of the transistors. To this end, the common well receives a bias voltage which is regulated as a function of a control signal representing the desired power supply voltage, in such a way as to adapt thereto the threshold voltages of the transistors situated in the well in question. Hence, it is possible to adapt the consumption of the integrated circuit to the operating conditions which it is desired to impose on it depending on the circumstances. For example, when a computer equipped with such a circuit is on standby, the well voltage is matched to this operating condition in order to allow the circuit to operate at a lower power supply voltage.

It is known, in fact, in a general way, that the control of the threshold voltages of MOS transistors (and consequently of well voltages) is a major problem when it is desired to ensure, on the one hand, safety of operation of the circuits and, on the other hand, minimum consumption by the latter, especially when the threshold voltages are low.

This problem becomes particularly crucial when the circuits are fed from a limited energy source, such as a battery or electromagnetic radiation. CMOS (Complementary-Metal-Oxide-Semiconductor) technology features among the technologies used for low-consumption applications. It is within this technology that the present invention finds a particularly appropriate application. This CMOS technology will therefore be taken as a basis for the description which will follow, but it should be noted at the outset that the latter is applicable, by analogy, to other MOS-type technologies.

In CMOS technology, the power $P_t$ consumed by a logic gate is equal to the sum of the dynamic power $P_{dyn}$ and the static power $P_{stat}$ and it can be expressed as follows:

$$P_t = P_{dyn} + P_{stat} = fCV^2 + \frac{V}{2}\left[I_{DSn}e^{\frac{-V_{tn}}{n_n U_T}} + I_{DSp}e^{\frac{-V_{tp}}{n_p U_T}}\right] \quad (1)$$

where $I_{DSn}$ and $I_{DSp}$, are the specific drain currents, under slight reverse bias, of the MOS transistors, respectively of n type and of p type, f is the switching frequency of the logic gate, C is the whole of its stray capacitances loading its output, V is its power supply voltage, $n_n$ and $n_p$ are the slopes, under slight reverse bias, of the MOS transistors respectively of n type and of p type constituting this logic gate, $V_{tn}$ and $V_{tp}$ are the threshold voltages of the MOS transistors, respectively of n type and p type, and $U_T$ is the value of the thermal potential of these MOS transistors. It is seen from this relation that one parameter which makes it possible significantly to reduce the power consumed by the logic gate is the power supply voltage V, since this parameter appears squared in formula (1) above.

However, the delay Td of a logic gate, in strong inversion, is expressed by the relation:

$$T_d = \frac{CV}{\frac{\beta}{2n}(V - V_t)^2} \quad (2)$$

where β/2n is a technological factor for each MOS transistor. By lowering only the power supply voltage, it is seen that the delay of the logic gate increases. In order to avoid the operating speed reducing when the power supply voltage V is lowered, it is necessary also to lower the threshold voltages. From the technological point of view, it is possible to lower the threshold voltages $V_t$ of MOS transistors. However, the static component of the power consumed by the logic gate then takes on greater importance (see formula (1)). Moreover, the dispersion in the threshold voltages due to the technology or their variation due to temperature easily reaches a relatively high value of ±200 mV. The existence of such a margin of uncertainty in the value of the threshold voltages does not make it possible to ensure minimum consumption.

Nevertheless, it is possible to act on the threshold voltage of an MOS transistor by electronic means. As already indicated in the prior patent application cited above, this action can be taken via a biasing of the well voltage with respect to the sources of the MOS transistors produced in this well. In order to do this, the MOS transistors on which it is desired to impose a given threshold voltage must, on the one hand, all be of the same type of conductivity and, on the other hand, be implanted in a well insulated from the power supply voltages. It will easily be understood that if several different threshold voltages are desired, it will be necessary to have available the same number of wells insulated from one another, it being understood that the expression "same well" here means either a single well, or several electrically connected wells.

It will be recalled that, if the substrate is of n type, the simplified structure represented in FIG. 1 is used for an n-type transistor. It is implanted in a p-type well 2, the well being itself implanted in an n-type substrate 3. The MOS transistor 1 consists of two n-type regions 4 and 5, respectively the source and the drain, formed in the well 2, as well as of an insulated layer 6 forming the gate.

A p-type region 7 is diffused into the well 2 in order to allow the latter to be biased. Moreover, an n-type region 8 is diffused into the substrate 3 so as to be able to apply a voltage, for example the power supply voltage V+, to the MOS transistor 1 and to other transistors (not represented) which constitute the circuit produced in the substrate 3.

The structure represented in FIG. 1 forms not only the MOS transistor 1 but, moreover, creates several diode Junctions between the adjacent n and p regions. It results therefrom that parasitic bipolar elements are formed by the same structure. FIG. 2 shows the main parasitic bipolar elements associated with the MOS transistor 1 of FIG. 1. Thus, in FIG. 2 can be seen the diagram of the MOS transistor I and the diagrams of the parasitic bipolar transistors 10, 11 and 12. The bipolar transistor 10 is formed in parallel with the MOS transistor 1, the collector and the emitter of the bipolar transistor 11 are formed between the drain of the MOS transistor I and the power supply voltage V+, while the collector and the emitter of the bipolar transistor 12 are formed between the source of the MOS transistor 1 and the power supply voltage V+. The bases of these parasitic transistors are all linked to the well of the MOS transistor.

The bipolar transistors 11 and 12 can be made practically inoperable in respect of the operation of the MOS transistor i by known means of a technological and topological character. Only the effect of the bipolar transistor 10 can not be completely eliminated by these means, its collector-emitter current still flowing parallel to the drain-source current of the MOS transistor 1.

In FIG. 2 it is seen that the voltage applied between the well and the source of the MOS transistor 1 is also applied between the base and the emitter of the bipolar transistor 10 and it can be such as to alter the collector-emitter current of the latter. By analogy, the same reasoning is applied to the p-type MOS transistors, which have not been represented for the sake of simplification.

The currents of an MOS transistor in strong and weak inversion are given, respectively, by the following well-known formulae:

$$I_d = \frac{\beta}{2n}(V_{GS} - V_t)^2 \quad (3)$$

and $$I_d = K_W \beta U_t^2 e^{\frac{V_{GS} - V_t}{n U_t}} \quad (4)$$

where $\beta$ and $K_w$ are constants.

Moreover, the threshold voltage $V_t$ of an MOS transistor may be expressed, to a first approximation, by the relation:

$$V_t = V_{to} - V_{BS}(n-1) \quad (5)$$

in which $V_{to}$ represents the threshold voltage fixed by the technology and $V_{BS}$ is the voltage difference between the well and the source of the transistor.

The formulae (3) and (5) above show that the threshold voltage $V_t$ can be controlled by biasing of the well. If a low threshold voltage is chosen, it is possible, for a given drain current $I_d$, to reduce the gate-source voltage $V_{GS}$ in a corresponding way. However, if the gate-source voltage can be reduced, the same goes for the power supply voltage, and this can be done without the operating speed of the logic gates being affected thereby. It is appropriate, however, to mention that, in this case, the static current, as given by the formula (4) above, increases.

The above considerations have been applied in the abovementioned patent application in order to establish the threshold voltage and, consequently, the well voltage, so as to be able to adapt the circuit to several power supply voltages available in practice.

However, it is known that the operating characteristics of a logic circuit may vary as a function of other factors, such as the static current, the temperature, the capacitance of the load applied to the circuit and other factors. The influence of these factors on the operation of the integrated circuit may, to some extent, be compensated for by a judicious adaptation of the well voltage and, consequently, of the threshold voltages of the transistors which, in their turn, have an influence on the consumption of the circuit and on its speed of operation.

However, the abovementioned patent application does not describe solutions other than that of adjusting the well voltage of the transistors on the basis of certain available power supply voltages, without taking account of other parameters possibly influencing the operation of the integrated circuit, nor taking account of the problems which can be posed in the matter of the speed of operation of the circuit.

The purpose of the invention is to propose a solution which, by setting the well and power supply voltages, makes it possible to take account of all the essential factors possibly influencing the operation of the circuit and, in particular, its consumption and its speed of operation.

Consequently, according to a first one of its aspects, the purpose of the invention is to supply a circuit for control of the voltages between the well and the sources of a plurality of MOS transistors and of a power supply voltage of an integrated logic circuit, making it possible to ensure minimum consumption thereof, while ensuring a suitable speed of operation.

Thus the object of the invention is firstly a circuit for controlling the voltages between the well and the sources of a plurality of MOS field-effect transistors with the same type of conductivity, said MOS transistors all being produced in the same well of the substrate of an integrated logic circuit, which comprises:

a reference MOS transistor produced in said well;

means for imposing predetermined operating conditions on said reference MOS transistor, means for comparing an operating characteristic of said reference MOS transistor with a reference value and for producing a control voltage representative of the difference between said operating characteristic and said reference value, and means for applying said control voltage between said well and the source of said reference MOS transistor so as to keep said operating characteristic of said reference MOS transistor at said reference value.

By virtue of these characteristics, the circuit according to the invention makes it possible to control the bias of the well of the MOS transistors and thus continuously to define the threshold voltage of the latter according to the operating conditions imposed on the reference transistor, the whole being capable of being produced in the form of one and the same integrated circuit.

A further subject of the invention is a slaving system, including at least one circuit as has just been defined and making it possible to define the threshold voltages of all the MOS transistors, having the same type of conductivity and belonging to a logic circuit, in such a way as to render the consumption of the logic circuit a minimum, independently of its level of activity.

The slaving system according to the invention makes it possible to define the threshold voltages of the MOS transistors so as to reduce the consumption to a minimum value, independently of the frequency of operation of the logic circuit or of its level of activity. Moreover, this slaving system makes it possible to take advantage of a technology at very low threshold voltage. In particular, it makes it possible to reach the lower limit of consumption of a logic circuit.

In the case of CMOS technology in which transistors with the two types of conductivities exist, the invention proposes using at least two circuits for control of the threshold voltages, namely one control circuit per type of conductivity. The slaving system will then include one and/or the other of thee control circuits.

Other characteristics and advantages of the invention will emerge in the course of the detailed but not limiting description which will follow of various embodiments of the control circuit and of the slaving system including the application thereof, the description being given solely by way of example, and given by reference to the attached drawings in which:

FIG. 1, already described, represents a diagrammatic sectional view of a substrate with an insulated well including an n-type MOS field-effect transistor;

FIG. 2, also already described, represents a diagram of the MOS transistor of FIG. 1 and of its parasitic bipolar transistors;

FIGS. 3*a* to 3*d* show, respectively, the symbols used in the attached drawings for a current source I, a current source controlled by a voltage V, a voltage source V and a voltage source controlled by a voltage V';

FIG. 4*a* represents the diagram of an example of a control circuit according to the invention for n-type MOS transistors;

FIGS. 4*b*, 4*c* and 4*d* show three variants of the layout of the reference transistor of FIG. 4*a* making it possible to take account of other operating characteristics;

FIG. 5 is a diagram of a control circuit according to the invention for p-type MOS transistors;

FIG. 6 is a diagram of a circuit according to FIG. 4*d*, for p-type transistors;

FIG. 8 represents a diagrammatic sectional view of an insulated-well substrate including n- and p-type MOS field-effect transistors;

Figure 7:
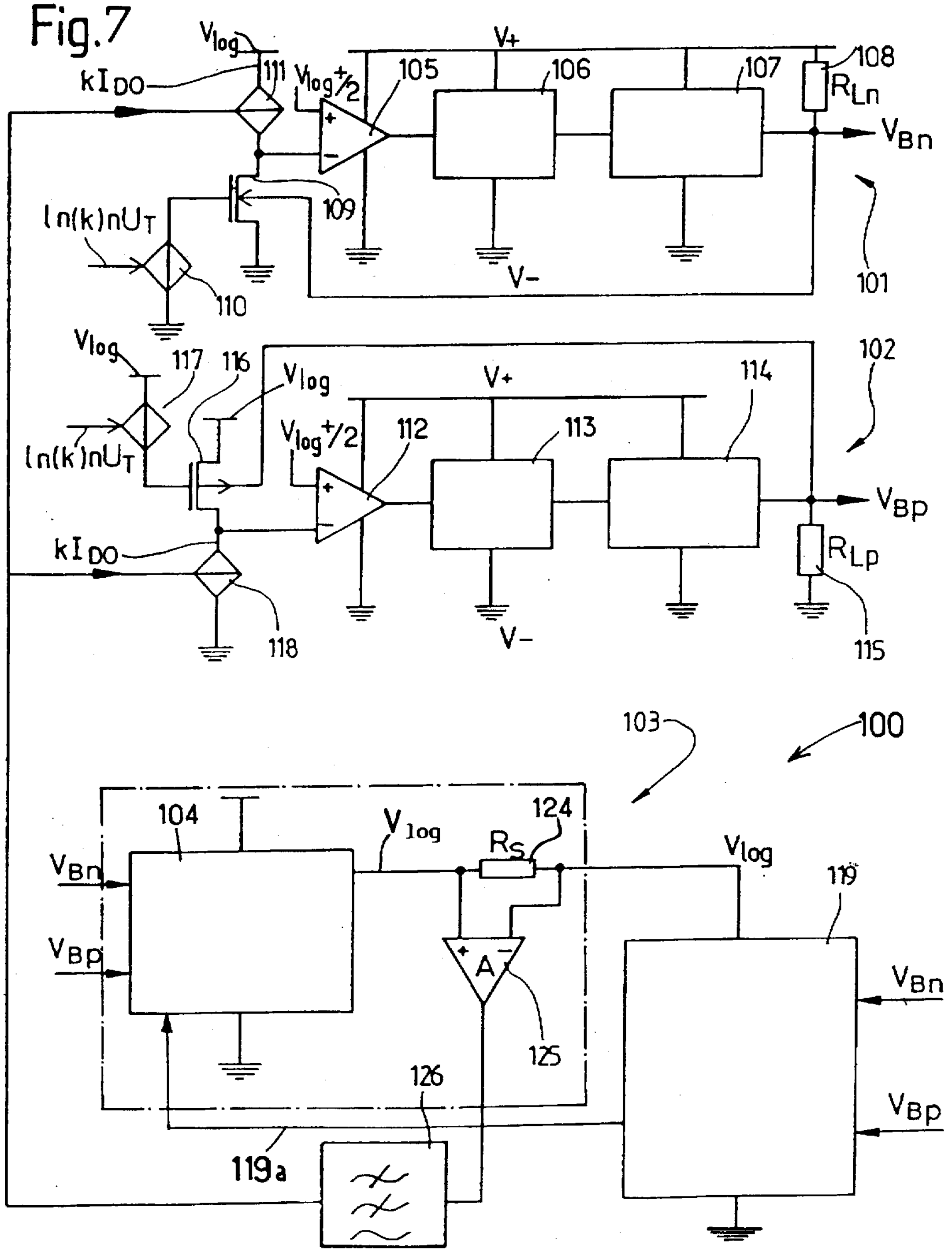
FIG. 7 is a diagram of a slaving system according to the invention.
Figure 9A:
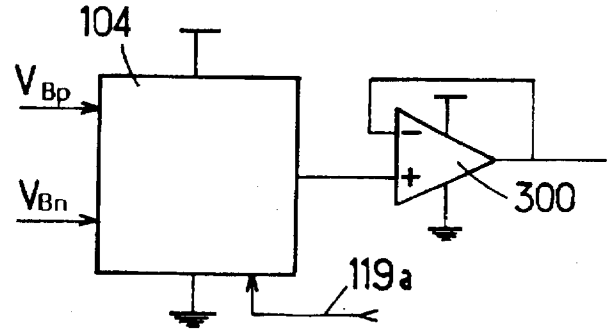
Figure 9B:
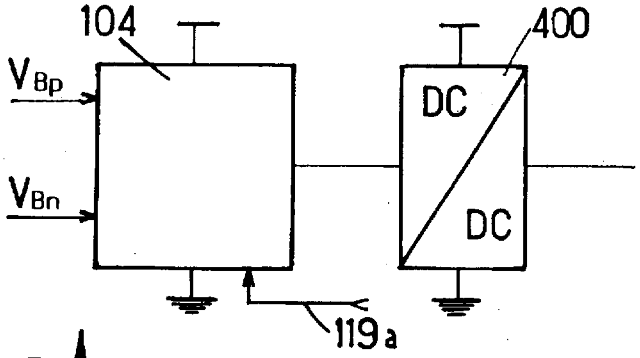
Figure 10:
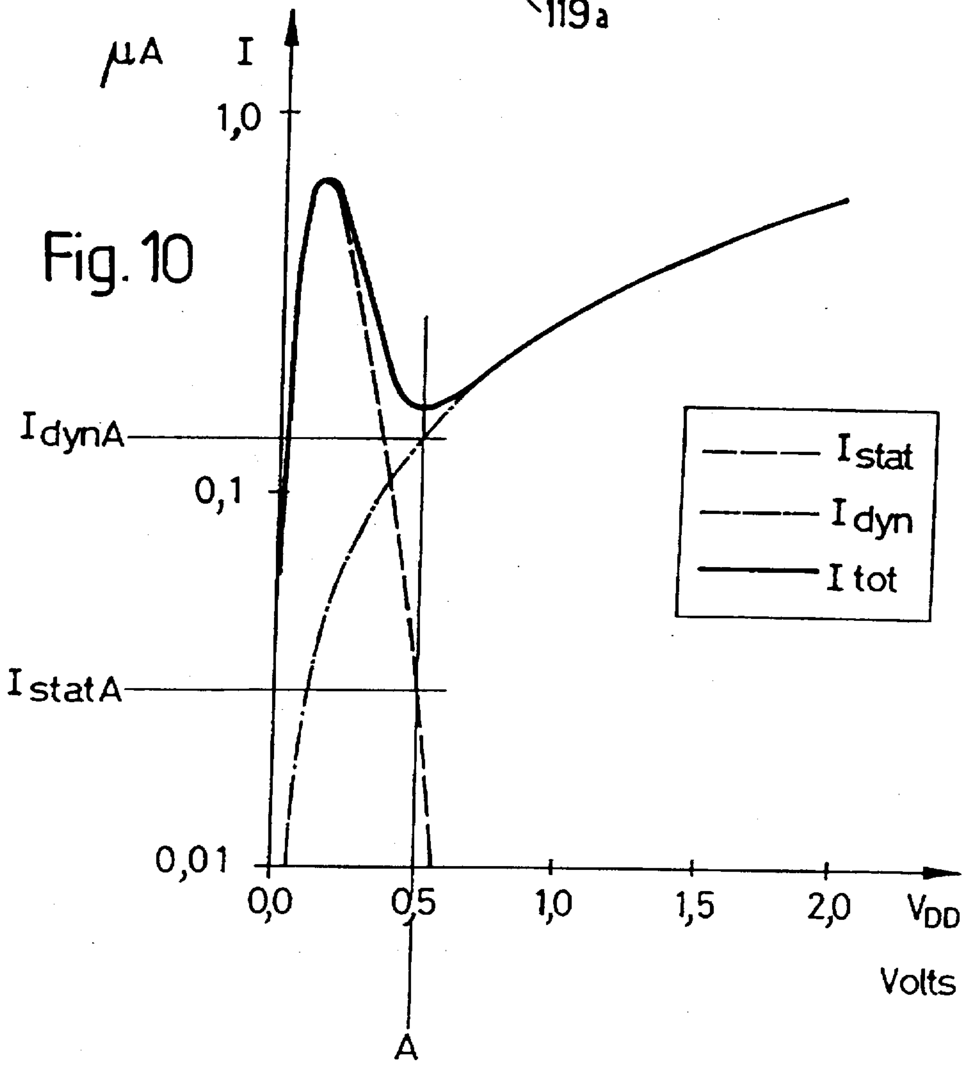
Figure 11:
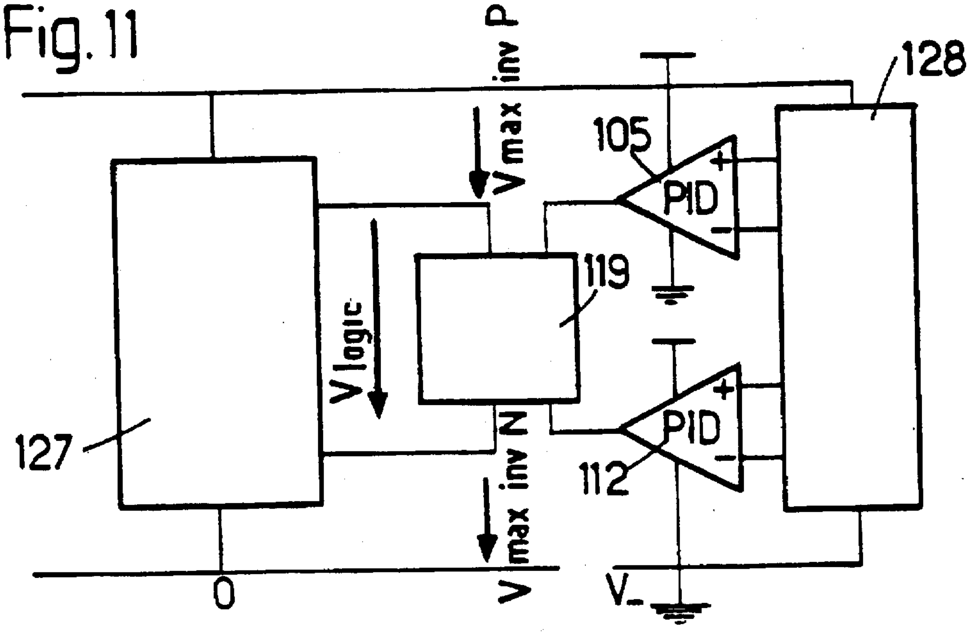
Figure 12:
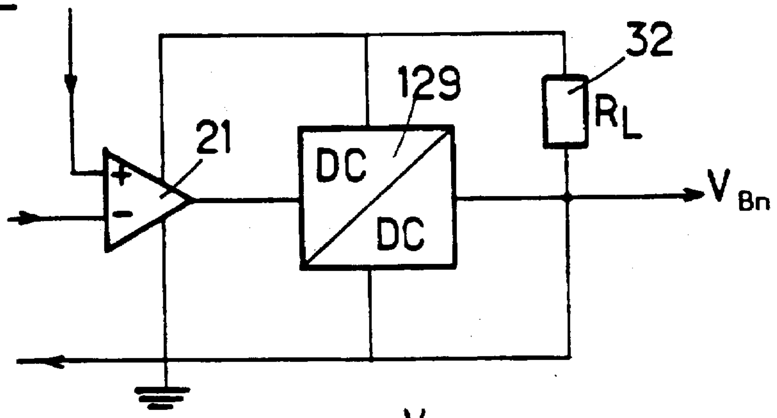
Figure 13:
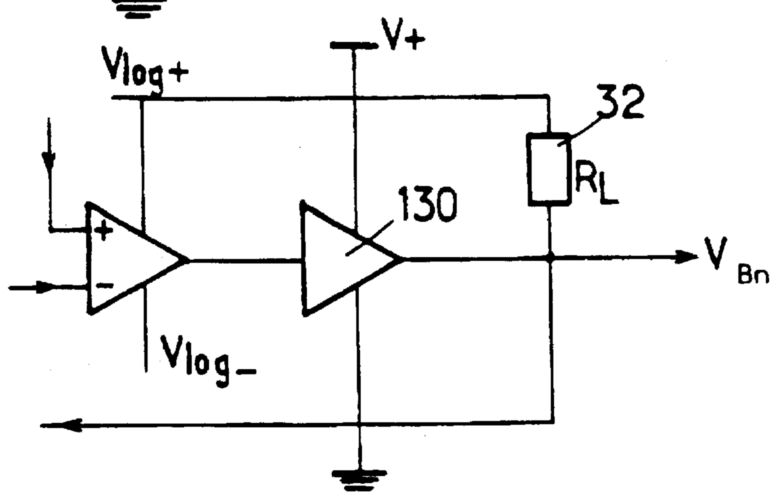

FIGS. 9*a* and 9*b* show two variant embodiments of the voltage generator 104 of FIG. 7; and, FIG. 10 is a graph showing curves of the dynamic current, of the static current and of the total current as a function of the power supply voltage, for a predetermined constant speed of operation of the logic circuit;

FIG. 11 shows the very much simplified diagram of a slaving system according to the invention in the case where the value of the power supply voltage makes it possible to omit certain components from the control circuit; and FIGS. 12 and 13 show two variants of the control circuit according to the invention.

Figure 4A:
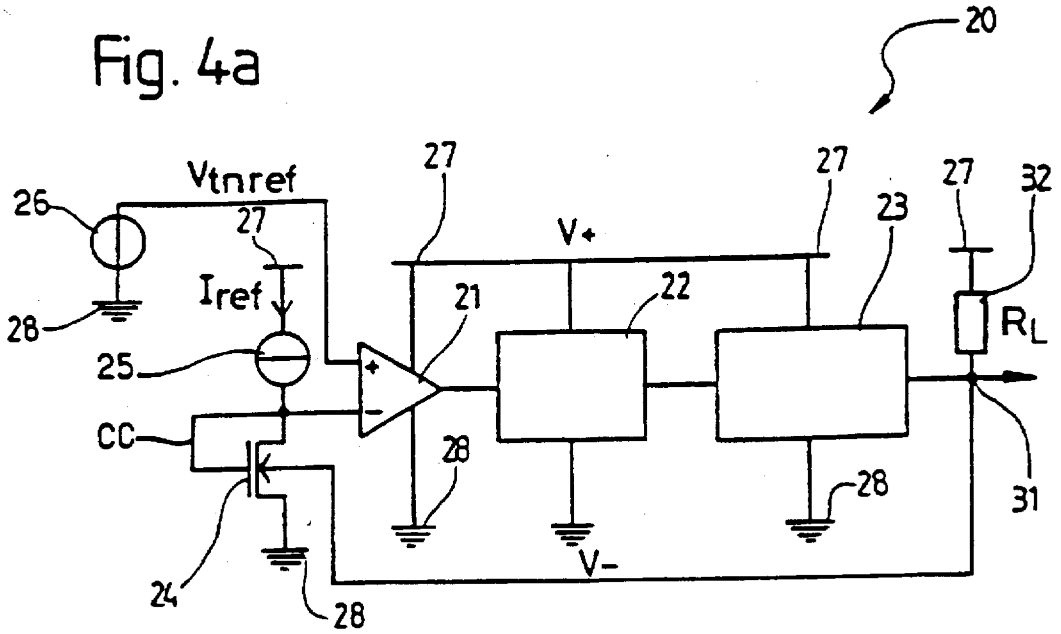

FIG. 4*a* represents the diagram of a control circuit 20 according to the invention which is intended for controlling the threshold voltages of a plurality of n-type MOS transistors constituting all or part of a logic circuit, for example. These transistors are all produced in the same well, or several wells linked together, of a substrate of an electronic chip (not represented). The control circuit 20 comprises a comparator 21, a voltage-controlled oscillator 22, a multiplier 23, an n-type MOS field-effect transistor 24, a current source 25 and a voltage source 26. Moreover, the control circuit 20 includes two terminals 27 and 28, intended to be linked respectively to a potential V+ and to a potential V−, and an output terminal 31. The difference between the potentials V+ and V− supplies the control circuit and can thus supply the whole of the logic circuit integrated on the same electronic chip and can be supplied by a power supply source such as a battery, for example.

The current source 25 is connected between the terminal 27 and the drain of the MOS transistor 24, the source of which is linked to the terminal 28. The current source 25 ensures that the drain-source current of the MOS transistor 24 is substantially equal to a value $I_{ref}$. The drain-source voltage of the MOS transistor 24 is imposed between the gate and the source of the MOS transistor 24 via a short-circuit CC between the gate and the drain.

The comparator 21 is fed by the terminals 27 and 28 and is, in fact, a PID (Proportional-Integral-Differential)-type regulator. The voltage source 26 is connected between the terminals 27 and 28 and supplies a voltage of a value $V_{tnref}$ to the positive input of the comparator 21. The negative input of the comparator 21 is linked to the drain of the MOS transistor 24. Thus, the comparator 24 performs a comparison between the voltage $V_{tnref}$ and the drain-source voltage of the transistor and supplies an error signal at its output representative of the difference between the voltages present at its inputs.

The voltage-controlled oscillator 22 is connected between the terminals 27 and 28. The frequency of the voltage-controlled oscillator 22 is determined by the value of the error signal supplied by the comparator 21. The multiplier 23 is fed by the terminals 27 and 28 and is linked to the voltage-controlled oscillator 22. It is designed to generate a voltage which depends on the frequency of the oscillator 22. The multiplier 23 is loaded by a resistor 32, linked between the terminal 27 and the output terminal 31. In one variant, the resistor 32 can be replaced by a current source.

Figure 1:
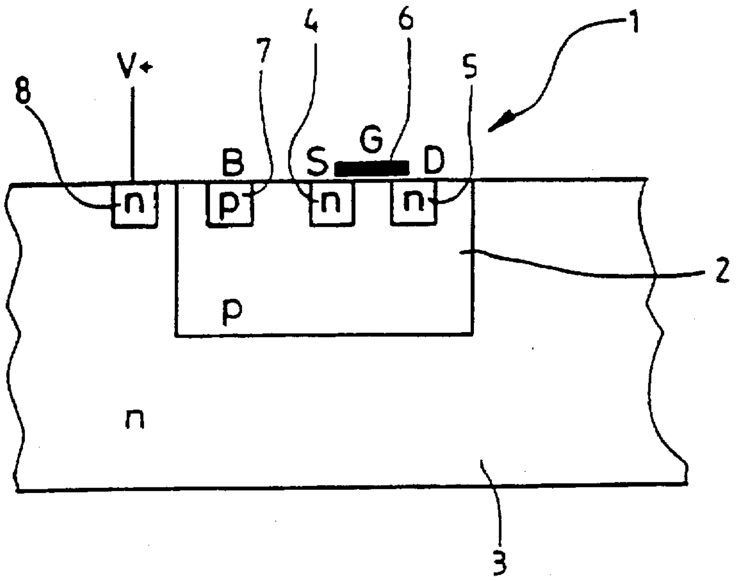

The output of the multiplier 23 is linked to the well 7 (see FIG. 1), so that the voltage produced by the circuit 20 is applied, on the one hand, between the well 7 and the source of the transistor 24 and, on the other hand, between this well 7 and the source of all the other MOS transistors which are produced there.

As was seen above (see formula (5)), the threshold voltage of an MOS transistor is altered-by biasing the well in which it is produced.

Figure 2:
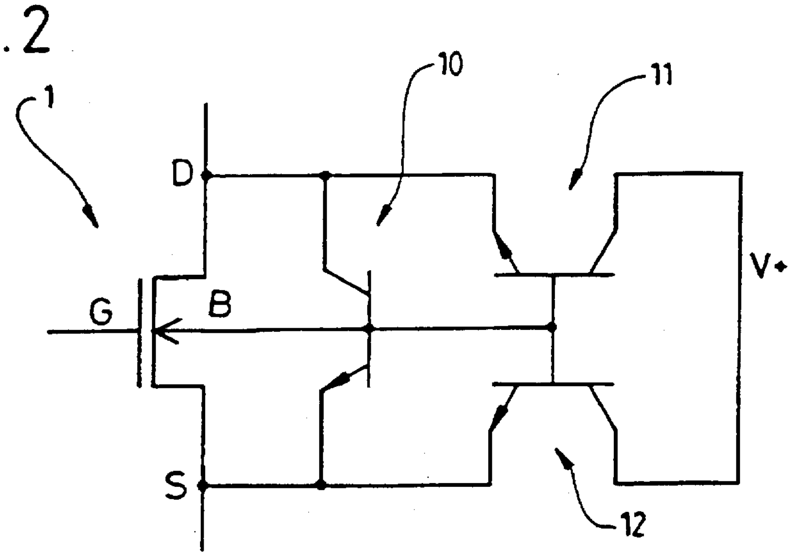
Figure 3A:
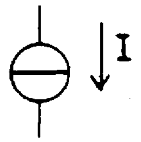
Figure 3B:
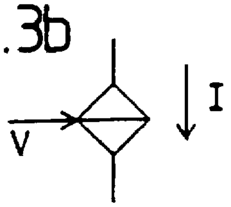
Figure 3C:
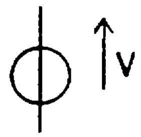
Figure 3D:
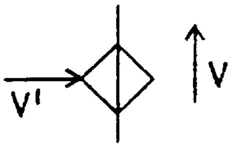

It results therefrom that the threshold voltage of an MOS transistor can be reduced by a positive well bias voltage. However, the maximum value of this voltage is limited by the current flowing through the bipolar transistor 10 which is formed in parallel with the MOS transistor 1 (see FIG. 2). In practice, this maximum value is approximately equal to 0.4 volt so that the current in the bipolar transistor 10 can be considered as negligible.

Moreover, the threshold voltage of the MOS transistor may be increased by a negative bias voltage of the well. The limit of this negative voltage is defined by the breakdown voltage of the base-emitter junction of the bipolar transistor 10 (of the order of several volts). That being so, the excursion in the threshold voltage $V_t$, when the well voltage $V_{BS}$ is negative, is higher than in forward bias. In the case of reverse bias, the voltages to be applied to the wells are often higher in absolute value than the power supply voltages of the logic circuit.

The embodiment of the circuit according to the invention which has Just been described makes it possible, by means of an imposed datum voltage $V_{tnref}$ to attain very low threshold voltages for the transistors. It results therefrom that the $V_{GS}$ voltage of the transistors can be reduced and that the logic circuit equipped with the control circuit according to the invention can be supplied with a comparatively lower power supply voltage.

Figure 4B:
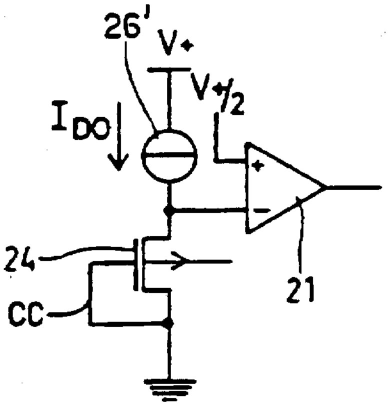
Figure 4C:
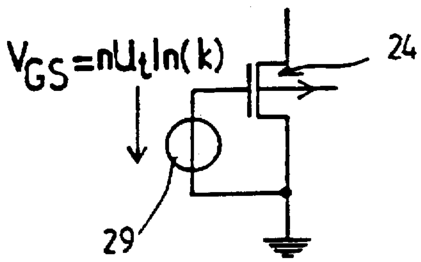

With the embodiments of FIGS. 4*b* and 4*c*, it is possible, as datum signal imposing defined operating characteristics on the transistor 24, to use the static current of the circuit so as to fix a minimum static power consumed by the latter, for a given speed of operation.

In the case of FIG. 4*b*, the transistor 24 carries a current $I_{DO}$ which thus represents the static current and which is imposed by the current source 26'. The transistor 24 is connected in such a way that its gate-source voltage is zero. The well voltage is then controlled so that the drain voltage of the transistor 24 is held at V+/2.

FIG. 4*c* shows other embodiment in which the datum is also the static current which is represented here by a value $$V_{GS}=n.U_T.\ln(k)$$

supplied by a voltage generator 29. This value fixes the gate voltage of the transistor 24 and thus the value of the drain-source current of the transistor 24.

Figure 4D:
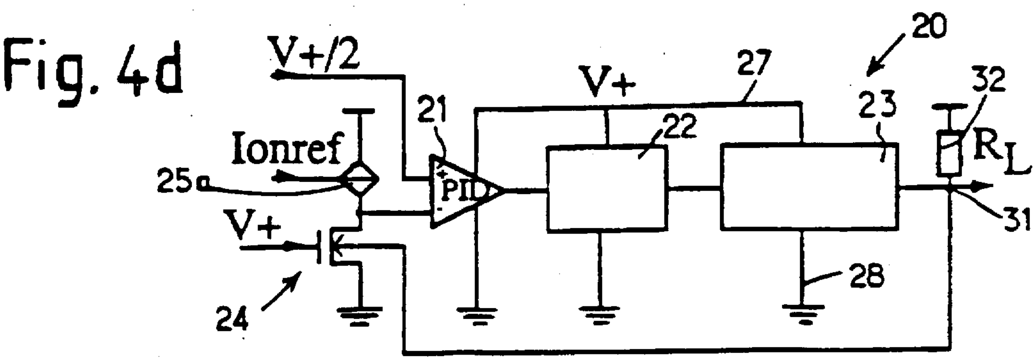

FIG. 4*d* shows another variant in which the datum signal is the saturation current $I_{onref}$ of the transistors which is applied as input signal to the current source 25*a*. The transistor 24 here receives the voltage V+ on its gate. This layout makes it possible to reduce to the minimum the static power consumed as a function of the power supply voltage, for a given speed of operation.

The multiplier 23 is capable of providing the excursion in the $V_{BS}$ voltage described above. The description of such a multiplier circuit, often designated by "charge pump" in relevant literature, may be found in an article by John F. Dickison, entitled "On-Chip High-Voltage Generation in MNOS Integrated Circuits Using an Improved Voltage Multiplier Technique", which appeared in the magazine IEEE Journal of Solid-State Circuits, Vol. SC-11, No. 3, June 1976.

FIG. 5 shows a control circuit 80 according to the invention, but this time for control of the well voltages of p-type MOS transistors. The operating principle of this circuit is substantially identical to that of the control circuit 20.

This circuit 80 comprises a comparator 21, a voltage-controlled oscillator 22, a multiplier 85, a resistor 32 and a current source 25, which all operate in the manner described above. Moreover, it comprises a p-type MOS transistor 81 and a voltage source 82. The voltage source 82 supplies a voltage equal to a value $V+-V_{tpref}$. The source of the MOS transistor 81 is linked to the terminal 27, while its drain is linked to one of the terminals of the current source 25 and to its own gate. The other terminal of the current source 25 is linked to the terminal 28.

As in the case of the control circuit 20, the current source 25 ensures that the drain-source current of the MOS transistor 81 is substantially equal to a value $I_{ref}$. As for the comparator 21, its positive input is linked to the drain of the MOS transistor 81, while its negative input is linked to the voltage source 82.

It is seen in FIG. 5 that the potential of the drain of the MOS transistor 81 is equal to $V+-V_{tp}$, where $V_{tp}$ is the threshold voltage. By applying a voltage $V+-V_{tpref}$ between the negative input of the comparator 21 and the terminal 28, a comparison is performed between a voltage $V_{tpref}$ and the voltage $V_{tp}$ of the MOS transistor 81.

FIG. 6 shows an example according to the invention, as an equivalent of the circuit represented in FIG. 4d, but for p-type transistors. The operating principle of the circuit 85 is also substantially identical to that of the circuit 23 and reference can therefore be made to the abovementioned article for further details.

The circuit represented in FIGS. 4a and 5 (or 4d and 6) make it possible to control the threshold voltage of MOS transistors with the two n and p types of conductivity, as long as the bias voltage remains within the possible limits defined by the conduction voltage, on the one hand, and the breakdown voltage of the well-source junction, on the other hand, of the transistors 24 and 81. These circuits can be completely integrated and their number of elements is low.

The circuits of the type described in connection with FIGS. 4d and 6 can be used, according to a wider aspect of the present invention, in slaved systems in which the threshold voltage is regulated as a function of one or more judiciously chosen parameters, such as, temperature, a value of current consumed, etc.

For example, the value of the threshold voltage $V_t$ may be determined so that the consumption of the logic circuit is a minimum for a given ratio of activity of the logic circuit.

There exists, in effect, an optimal threshold voltage $V_t$ for reaching the most favourable consumption by a logic circuit, this optimal voltage being a function of the architecture of the logic circuit and of its "level of activity".

The "level of activity" of a logic circuit is the name given to the ratio of the number of logic gates which are transiting at a given instant over the total number of gates of the circuit. This activity ratio therefore varies in the course of time.

FIG. 7 shows an example of a slaved system according to the invention employing a control circuit according to FIG. 4d and another one according to FIG. 8a. In this case, the ratio between the dynamic current and the static current consumed by a logic circuit is slaved. This makes it possible to optimize the threshold voltages of the MOS transistors constituting the logic circuit as a function of the level of activity of the latter.

The slaving system 100 represented in FIG. 7 indirectly measures the activity of the logic circuit via the dynamic current consumed and takes a fraction thereof as static current datum for the well voltage control circuits.

The ratio between these two quantities can be determined from the architecture and from the topology of the logic circuit.

The slaving system 100 comprises two control circuits 101 and 102, a current measuring circuit 103 and a reduced-voltage source 104. The control circuit 101 comprises a comparator 105, a voltage-controlled oscillator 106, a multiplier 107, a resistor 108 and an n-type MOS transistor 109. These elements and their operation are identical to the corresponding elements described in connection with FIGS. 4a and 4b. The control circuit 101 also comprises a current source 111 and a voltage source 110 which will be described below.

Likewise, the control circuit 102 comprises a comparator 112, a voltage-controlled oscillator 113, a multiplier 114, a resistor 115 and a p-type MOS transistor 116. These elements and their operation are identical to the corresponding elements and operation described in connection with FIG. 6.

The control circuit 102 further comprises a current source 118 and a voltage source 117 which will also be described later.

The slaving system 100 is intended to maintain the ratio between the dynamic power and the static power consumed by a logic circuit 119 at a defined value. The circuit may, for example, be the microprocessor of a portable computer or any circuit having a predetermined functionality.

This logic circuit 119 comprises n-type MOS transistors, of which the MOS transistor 109 forms part and which are all created in a first well, and p-type MOS transistors, of which the MOS transistor 116 forms part and which are all created in a second well. The first and second wells are electrically isolated from one another.

FIG. 8 shows an advantageous embodiment of such a logic circuit made in a common substrate according to a technology which is particularly well adapted to the application of the present invention, sometimes called "Real twin well" technology, in which separate wells are provided for the n-type and p-type transistors.

More precisely, this substrate 200 is of p-type, for example, and includes a first well 201 (or first wells 201) in which the PMOS transistors are formed, such as the transistor 202. The substrate 200 also has an n region 203 (or several n regions 203) in which one or more wells 204 is or are provided. The NMOS transistors of the logic circuit 119 are provided in this well or wells 204.

The configuration of FIG. 8 exhibits the advantage that, in the case in which several wells are provided respectively for the PMOS and NMOS transistors, it is possible to make them operate to the best of their abilities by taking account of the functions which they respectively have to accomplish and of the speed at which they respectively have to work. In effect, separate voltages perfectly adapted to these operating conditions can then be applied to the wells.

Coming back now to FIG. 7, it is seen that the reduced-voltage generator 104 is able to deliver a reduced voltage $V_{log}$ intended to supply the logic circuit 119. The well voltages of the n- or p-type MOS transistors which constitute this generator 104 are controlled by the voltages $V_{BN}$ or $V_{BP}$, supplied by the control circuits 101 and 102. In practice, the generator 104, as indicated in FIGS. 9a and 9b, comprises a voltage source 104a and an impedance matcher 300 or 400. The circuit 300 of FIG. 9a is an amplifier mounted in unit-gain mode. The circuit 400 of FIG. 9b is a DC-DC converter.

In an article entitled "A Voltage Reduction Technique for Battery-Operated Systems", which appeared in the magazine IEEE journal of Solid-State Circuits, Vol. 25, No. 5, October 1990, a technique has already been proposed making it possible to adjust the power supply voltage of logic circuits, on the basis of speed characteristics, of temperature conditions and of technological parameters, in order to obtain minimal consumption by these logic circuits. Such a technique may advantageously be used to determine the reduced voltage $V_{log}$ which is necessary and sufficient for the correct operation of the logic circuit 119. Thus the generator 104 of FIGS. 9a and 9b may be implemented by the circuit represented in FIG. 1 or that represented in FIG. 3 of the abovementioned article, it being understood, however, that the n-type and p-type transistors are produced in separate wells which are biased by the voltages $V_{BN}$ and $V_{BP}$, respectively.

The current measuring circuit 103 comprises a shunt resistor 124, a differential amplifier 125 and a low-pass filter 126. The resistor 124 is produced in series with the voltage generator 104 and the logic circuit 119. The two inputs of the differential amplifier 125 are linked respectively to the two terminals of the resistor 124, while the output of the amplifier 125 is linked to the input of the low-pass filter 126. The total current consumed by the logic circuit 119 is measured by the resistor 124 and by the amplifier 125. The low-pass filter 126 forms an average of this current value. Moreover, the generator receives information on operating speed of the logic circuit 119 via a line 119a, this information being representative of the level of operation of this circuit 119.

The output of the low-pass filter 126 is linked to the control input of the current sources 111 and 118, so that the latter supply this average current value as datum of the static current in the MOS transistors 109 and 116. The control circuits 101 and 102 make the respective well voltages vary in response to this datum so that a current with a value $kI_{DO}$ flows in the reference MOS transistors 109 and 116, where $I_{DO}$ is their drain-source current under slight negative bias (when their gate-source voltage is equal to zero) and where k is a factor which will be explained in what follows.

The fact that it is possible to calculate the static current datum from the total current is shown by the formulae below:

$$I_{tot} = I_{dyn} + I_{stat} \quad (6)$$

$$I_{stat} = \frac{I_{dyn}}{b} \quad \text{whence} \quad (7)$$

$$I_{stat} = \frac{1}{b+1} I_{tot} \quad (8)$$

where $I_{dyn}$ represents the value of the dynamic current and $I_{stat}$ the value of the static current and $I_{tot}$ the value of the total current.

The ratio b is given by the value $R_s$ of the resistor 124, the gain A of the amplifier 125 and the gain of the low-pass filter 126 as well as by the factor k. The factor k serves only to facilitate the measurement of the current $I_{DO}$ of the MOS transistors 109 and 116 under slight negative bias. The value $I_{DO}$ is generally small and, in order to make it more easily measurable, a voltage equal to $nU_t\ln(k)$ is applied, by means of voltage sources 110 and 117, between the gate and the source of each of the MOS transistors 109 and 116. Consequently, the drain-source current of the MOS transistors 109 and 116 takes the value $kI_{DO}$.

The consumption of the logic circuit 119 can be made optimal by choosing the appropriate ratio according to whether it is sought to minimize the current, the power or the energy consumed by the logic circuit. FIG. 10 is a graph showing, for a given speed of operation of the logic gates, the curves of the dynamic current $I_{dyn}$, of the static current $I_{stat}$ and of the total current $I_{tot}$ of an MOS circuit with respect to the power supply voltage $V_{DD}$ of the circuit, the threshold voltages of the MOS transistors constituting the logic circuit being assumed to vary so as to satisfy said operating speed.

It is seen that two current consumption minima exist, a first close to zero volts and another which is a function of the level of activity and of the architecture of the circuit. The minimum close to zero volts is not usable, since the corresponding power supply voltage is insufficient to ensure correct operation of the logic circuit. However, for a value A of the power supply voltage $V_{DD}$, there exists another minimum which, in the example considered, is situated at a voltage of about 0.5 volt. The ratio between the dynamic current $I_{dynA}$ and the static current $I_{statA}$ may, for example, be determined from these curves drawn up for a given technology and speed of operation, and the values of b and of k can thus be defined.

Numerous modifications can be applied to the control circuit and to the slaving system according to the invention, various embodiments of which have Just been described, without in any way departing from the scope of this invention.

In particular, the assembly formed by the voltage-controlled oscillator 22 and the voltage multiplier 23 are [sic] not necessary for the correct operation of the slaving system, when the power supply voltage available is high enough to provide the excursion of the bias voltage for the wells, which is necessary to fix the threshold voltages.

As represented in FIG. 11, the wells of the logic circuit 119 are then connected directly to the outputs of the respective comparators 105 and 112 supplying the voltages $V_{bn}$ and $V_{bp}$ while the n and p transistors of the logic circuit operate with the aid respectively of a voltage lower than V+ and of a voltage higher than V−, the voltages V+ and V− being supplied by a power supply source 127. For the sake of simplification, the diagram of FIG. 11 shows a single block 128 to symbolize the reference transistors 109 and 116 and their associated elements.

That being so, the bias voltages of the wells can vary between V+ and V−, respectively more positive and more negative than the voltages of the sources of the MOS transistors used in the logic circuit 119. In this case, it is then possible to use the principle described above for fixing the threshold voltages in order to maintain the ratio, either between the dynamic power and the static power, or between the dynamic current and the static current, or equally between the dynamic energy and the static energy.

According to another variant represented in FIG. 12, it is possible to insert, between the comparator 105 or 112 and the outputs-of the regulation circuits 20 and 80, a DC/DC converter 129, produced, for example, by the use of a coil and of capacitances (circuits called buck converter, buck-boost converter or also boost converter). It is also possible to produce this converter 129 using switched capacitances.

According to another variant represented in FIG. 13, the circuits 22 and 23 or 106, 107, respectively 113 and 114, may be replaced by an amplifier 130 fed by voltages V+ and V− higher, or respectively lower, than the power supply voltages-of the logic circuit 119. This case thus applies equally if the power supply voltage makes it possible to supply these voltages.

The person skilled in the art will notice further that the means used to impose specific operating conditions on the reference MOS transistors shown in FIGS. 4, 4*d* and 5 to 7 are only examples for achieving this purpose. Other circuits based on the principles of the invention could thus be produced without departing from the scope of the invention. Likewise, it would be possible to choose an operating characteristic of the reference MOS transistors other than those described above in order to implement the principles of the invention, byway of the biasing of the well or wells.

Furthermore, in order to ensure that the reference transistors are as representative as possible of the transistors of the circuit to be controlled, it could be advantageous for them to be constituted by the parallel arrangement of several transistors arranged at several locations in the circuit in its entirety. Such an embodiment makes it possible to overcome variations, such as variations in temperature or of technological parameters, which may exist from one point of the circuit to another.

We claim:

1. An integrated circuit comprising:

a substrate;

a well defined in said substrate and having a well connection;

a plurality of MOS field-effect transistors defined in said well, said plurality of transistors having a first type of conductivity;

a reference MOS transistor also defined in said well, said reference MOS transistor having said first type of conductivity and having respective source, drain and gate connections;

first and second connections of said circuit to a power supply, said power supply applying a voltage difference between said connections for acting as the power supply to said circuit;

means for providing a first reference voltage;

comparison means for comparing said first reference voltage with a second voltage dependent upon the voltage between said source and drain connections of said reference MOS transistor and for producing an error voltage representative of the difference between said first and second voltages, said second voltage being representative of a predetermined operating characteristic of said reference MOS transistor;

amplifying means powered by said power supply connected to said comparison means for amplifying said error voltage to a third voltage having a maximum excursion that is greater than the absolute value of said voltage difference; and means connected between said amplifying means and said well connection for applying said third voltage to said well for imposing said predetermined operating characteristic of said reference MOS transistor on said plurality of MOS field-effect transistors.

2. The circuit as claimed in claim 1, wherein said operating characteristic of the reference MOS transistor is its threshold voltage.

3. The circuit as claimed in claim 1, wherein said operating characteristic of the reference MOS transistor is its static current.

4. The circuit as claimed in claim 1, wherein said operating characteristic of the reference MOS transistor is its saturation current.

5. The circuit of claim 1 where said amplifying means includes:

a voltage controlled oscillator connected to said comparison means for generating a signal having a frequency that varies in response to the variation of said error voltage;

a multiplier connected to said voltage controlled oscillator for generating said third voltage, said third voltage being representative of said frequency.

6. The circuit as claimed in claim 1, further comprising generator means for generating a fourth voltage and connected between said gate and source connections of said reference MOS transistor, said fourth voltage ($V_{gs}$) having a value:

$$V_{gs}=N.U_r.\ln(k)$$

where n is the slope in slight reverse bias in said substrate of said reference MOS transistor, $U_r$ is the thermal potential of said reference MOS transistor, and k is the ratio between the drain current of said reference MOS transistor when said fourth voltage is equal to said first reference voltage, over the drain current of said reference MOS transistor when said fourth voltage is equal to zero.

7. The circuit according to claim 5, wherein said multiplier includes a charge pump.

8. The circuit as claimed in claim 1, wherein said amplifying means comprise a DC/DC convertor connected to said comparison means for producing said third voltage.

9. The integrated circuit of claim 1 further comprising:

generating means for generating a signal representative of a predetermined operating parameter of said integrated circuit; and first control means connected to said generating means and said reference MOS transistor for controlling said second voltage as a function of said operating parameter of said integrated circuit.

10. An integrated circuit according to claim 9 further comprising means for supplying current to said circuit, means for forming an average current value of said current supplied to said circuit as a datum of static current, and wherein said operating parameter is the static current drawn by said circuit.

11. An integrated circuit according to claim 9 having a given temperature wherein said operating parameter is said temperature.

12. An integrated circuit according to claim 9, further comprising a second well defined in said substrate and having a second well connection;

a second plurality of MOS field-effect transistors defined in said second well, said second plurality of transistors having a second type of conductivity;

a second reference MOS transistor also defined in said second well, said second reference MOS transistor having said second type of conductivity and having respective source, drain, gate and well connections;

means for providing a second reference voltage;

second comparison means for comparing said second reference voltage with a fourth voltage dependent upon the voltage between said source and drain connections of said second reference MOS transistor for producing a second error voltage representative of the difference between said second reference voltage and said fifth voltage, and fourth voltage being representative of a predetermined operating characteristic of said second reference MOS transistor;

second amplifying means connected to said second comparison means for amplifying said second error voltage to a fifth voltage having a maximum amplitude that is greater than the absolute value of said voltage difference; and means for applying said fifth voltage to said second well connection for imposing said predetermined operating characteristic of said second reference MOS transistor on said second plurality of MOS field-effect transistors; and second control means connected to said generating means and said second reference MOS transistor for controlling said fourth voltage as a function of said operating parameter of said integrated circuit.

13. An integrated circuit as claimed in claim 12 wherein said plurality of MOS field effect transistors of a first type of conductivity and said plurality of MOS field effect transistors of a second type of conductivity form together a logic circuit, and wherein said generating means includes current sensing means connected between said source of supply potential and said logic circuit for generating a signal representative of the total current supplied to said logic circuit by said source of supply potential, and means for averaging said signal representative of said total current thereby generating a static current value, said means for averaging being connected between said current sensing means and said first and second control means for applying thereto respective signals representative of the static current drawn by said logic circuit.

14. An integrated circuit as claimed in claim 12, wherein said first and second control means comprise current sources respectively series connected with said first and second reference MOS transistors.

15. An integrated circuit according to claim 5, further including a load resistor connected to said multiplier.

16. An integrated circuit comprising:

a substrate;

a first well defined in said substrate and having a first well connection;

a first plurality of MOS field-effect transistors defined in said first well, said first plurality of transistors having a first type of conductivity;

a first reference MOS transistor also defined in said first well, said first reference MOS transistor having said first type of conductivity and having respective source, drain, gate and well connections;

means for providing a first reference voltage;

first comparison/producing means for comparing said first reference voltage with a second voltage dependent upon the voltage between said source and drain connections of said first reference MOS transistor, and for producing a first control voltage representative of the difference between said first and second voltages, said second voltage being representative of a predetermined operating characteristic of said first reference MOS transistor;

means for applying said first control Voltage to said first well connection for imposing said predetermined operating characteristic of said first reference MOS transistor on said first plurality of MOS field-effect transistors;

generating means for generating a signal representative of one of the following operating parameters of the circuit: the temperature of, the current consumed by or the supply voltage applied to said integrated circuit; and first control means connected to said generating means and said first reference MOS transistor for controlling said second voltage as a function of said operating parameter of said integrated circuit.

17. An integrated circuit according to claim 16, further comprising a second well defined in said substrate and having a second well connection;

a second plurality of MOS field-effect transistors defined in said second well, said second plurality of transistors having a second type of conductivity;

a second reference MOS transistor also defined in said second well, said second reference MOS transistor having said second type of conductivity and having respective source, drain, gate and well connections;

means for generating a second reference voltage;

second comparison producing means for comparing said second reference voltage with a third voltage dependent upon the voltage between said source and drain connections of said second reference MOS transistor for producing a second control voltage representative of the difference between said second reference voltage and said third voltage, said third voltage being representative of a predetermined operating characteristic of said second reference MOS transistor;

means for applying said second control voltage to said second well connection for imposing said predetermined operating characteristic of said second reference MOS transistor on said second plurality of MOS field-effect transistors; and second control means connected to said generating means and said second reference MOS transistor for controlling said third voltage as a function of said operating parameter of said integrated circuit.

18. An integrated circuit as claimed in claim 16 wherein said plurality of MOS field effect transistors of a first type of conductivity and said plurality of MOS field effect transistors of a second type of conductivity form together a logic circuit and further comprising a voltage source for supplying power to said logic circuit;

said generating means including current sensing means connected between said voltage source and said logic circuit for generating a signal representative of the total current supplied to said logic circuit by said voltage source, and means for averaging said signal representative of said total current thereby generating a static current value, said means for averaging being connected between said current sensing means and said first and second control means for applying thereto respective signals representative of the static current drawn by said logic circuit.

* * * * *

UNITED STATES PATENT AND TRADEMARK OFFICE

CERTIFICATE OF CORRECTION

PATENT NO. : 5,682,118

DATED : October 28, 1997

INVENTOR(S) : Vincent Von Kaenel and Matthijs D. Pardoen

It is certified that error appears in the above-identified patent and that said Letters Patent is hereby corrected as shown below:

On the title page, item [54] and Column 1, the title should read
-- CIRCUIT FOR CONTROLLING THE VOLTAGES BETWEEN WELL AND SOURCES OF THE TRANSISTORS OF AN MOS LOGIC CIRCUIT, AND SYSTEM OF THE POWER SUPPLY TO THE LATTER INCLUDING THE APPLICATION THEREOF --

UNITED STATES PATENT AND TRADEMARK OFFICE

CERTIFICATE OF CORRECTION

PATENT NO. : 5,682,118

DATED : October 28, 1997

INVENTOR(S) : Vincent Von Kaenel and Matthijs D. Pardoen

It is certified that error appears in the above-identified patent and that said Letters Patent is hereby corrected as shown below:

Col. 1, Equation (1) should read as follows:

$$P_t = P_{dyn} + P_{stat} = \int CV^2 + \frac{V}{2}\left[ I_{DSn^e}\frac{-v_m}{n_nU_T} + I_{DSp^e}\frac{-v_m}{n_pU_T} \right] \qquad (1)$$

Col. 2, line 60, "I" should read --1--;

Col. 3, line 1, "i" should read --1--;

Col. 4, line 54, "thee" should read --the--;

Col. 5, line 65, after "transistor" add --24,--;

Col. 11, line 20, "byway" should read -- by way--.

Signed and Sealed this

Fifth Day of September, 2000

*Attest:*

Q. TODD DICKINSON

*Attesting Officer*

*Director of Patents and Trademarks*